US006934671B2

(12) United States Patent
Bertsch et al.

(10) Patent No.: US 6,934,671 B2
(45) Date of Patent: Aug. 23, 2005

(54) METHOD AND SYSTEM FOR INCLUDING PARAMETRIC IN-LINE TEST DATA IN SIMULATIONS FOR IMPROVED MODEL TO HARDWARE CORRELATION

(75) Inventors: John E. Bertsch, South Hero, VT (US); Daniel S. Coops, Burlington, VT (US); David M. Fried, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 816 days.

(21) Appl. No.: 09/867,375

(22) Filed: May 29, 2001

(65) Prior Publication Data

US 2002/0193892 A1 Dec. 19, 2002

(51) Int. Cl.$^7$ .......................... G06F 17/50; G06F 9/45; G06F 19/00; G06F 17/18; G01R 27/28
(52) U.S. Cl. ............................. 703/14; 703/13; 703/15; 716/5; 700/108; 700/109; 700/110; 702/179; 702/182; 702/183; 702/184; 702/185; 702/117
(58) Field of Search ................................ 703/13–15, 6; 700/108–110, 121; 716/5; 702/179–185

(56) References Cited

U.S. PATENT DOCUMENTS

| | | | | |
|---|---|---|---|---|
| 5,663,076 A | * | 9/1997 | Rostoker et al. | 438/14 |
| 5,719,796 A | * | 2/1998 | Chen | 703/13 |
| 5,966,312 A | * | 10/1999 | Chen | 703/6 |
| 6,055,460 A | * | 4/2000 | Shopbell | 700/121 |
| 6,185,472 B1 | * | 2/2001 | Onga et al. | 700/121 |
| 6,239,591 B1 | * | 5/2001 | Bryant et al. | 324/158.1 |
| 6,418,353 B1 | * | 7/2002 | Rostoker et al. | 700/121 |

OTHER PUBLICATIONS

Van Zant, P. Microchip Fabrication: A Practical Guide to Semicondutor Processing. ISBN 0–07–135636–3. © 2000. Chapter 15.*

Rajsuman, R. System–on–a–Chip: Design and Test. ISBN 1–58053–107–5. © 2000. Chapters 4 and 9–11.*

Kuijstermans, F.C.M. et al. "Direct–Oriented Test Methodology for Complex Mixed–Signal Circuits." Proc. of the 1995 European Conference on Design and Test. 1995. pp. 18–23.*

Strojwas, A.J. "CMU–CAM System." Proc. of the $22^{nd}$ ACM/IEEE Conf. on DAC. 1985. pp. 319–325.*

Lee, Sang–Hoon et al. "An Efficient Statistical Analysis Methodology and Its Application to High–Density DRAMs." PRoc. of the 1997 IEEE/ACM Int'l COnf. on CAD. 1997. pp. 678–683.*

Diez, J.M. et al. "Influence of Manufacturing Variations in Iddq measurements" Proc. of the DAC Conf Europe. 2000. pp. 645–649.*

Gibson, D.S. et al. "Using Multivariate Nested Distributions to Model Semiconductor Manuf. Processes." IEEE Transactions on Semiconductor Manuf. vol. 12, No. 1, Feb. 1999. pp. 53–65.*

Heineken, H.T. "Performance—Manufacturability Tradeoffs in IC Design." Proc. of the Conf. of D AC in Europe. 1998. pp. 563–569.*

(Continued)

Primary Examiner—Kevin J. Teska
Assistant Examiner—Ayal Sharon
(74) Attorney, Agent, or Firm—McGinn & Gibb, PLLC; Richard M. Kotulak, Esq.

(57) ABSTRACT

A method of performing model to hardware correlation that simulates models based upon design criteria and manufactures devices based upon the design criteria. The method evaluates features of the devices during the manufacturing to produce in-line test parametric data, compares the models to the in-line test parametric data to obtain correlation data, and modifies the simulating according to the correlation data.

36 Claims, 4 Drawing Sheets

OTHER PUBLICATIONS

Strojaws, A.J. "Design for Manfacturability and Yield". Proc. of the 26$^{th}$ ACM/IEEEE DAC. 1989. pp. 454–459.*

Michael, C. et al. "A Flexible Statistical Model for CAD of Submicrometer Analog CMOS Integrated Circuits" Proc. of the 1993 IEEE/ACM/ Int'l Conf on CAD. 1993. pp. 330–333.*

Orshansky, M. et al. "A Statistical Performance Simulation Methodology for VLSI circuits." Proc. of the 35$^{th}$ Annual DAC > 1998. pp. 402–407.*

Abel, C.J. et al. "Characterization of Transistor Mismatch for Statistical CAD of Submicron CMOS Analog Circuits." Int'l Symposium on Circuits and Systems. 1993. pp. 1401–1404.*

Felt, E. et al. "Hierarchical Statistical Characterization of Mixed–Signal Circuits Using Behavioral Modeling." Proc. of the 1996 IEEE/ACM Int'l Conf. on CAD. 1997. pp. 374–380.*

* cited by examiner

METHOD AND SYSTEM FOR INCLUDING PARAMETRIC IN-LINE TEST DATA IN SIMULATIONS FOR IMPROVED MODEL TO HARDWARE CORRELATION

BACKGROUND OF THE INVENTION

1. Field of the Invention

The present invention generally relates to software programs that simulate the physical structures that will be produced by manufacturing processes, and more particularly to an improved method and system that correlates the software results to actual hardware devices produced.

2. Description of the Related Art

A major element in the qualification of any new semiconductor technology, circuit element, or product is a model to hardware correlation (MHC). An MHC is an exhaustive process that involves comparing a software based simulation of several devices (e.g., circuits) with the hardware performance of the same device or circuit. This activity allows circuit designers, technology developers and EDA (Electronic Design Automation) tools developers to find any mismatch between the technology specifications and the end product delivered from the manufacturing facility. Any mismatch is addressed and a further MHC is pursued to verify the solution.

An MHC is fairly simple if all the process parameters are run at exactly nominal conditions. However, the manufacturing line only guarantees that each parametric parameter will be in a certain range. The overall range of all of these parameters is called the "Process Window". Often qualification engineers wish to evaluate the MHC at corners of the Process Window that are artificially skewed away from nominal conditions. For example, several lots of test sites may be run with artificially long channel lengths to evaluate if the device model is still accurate in case the manufacturing line allows channel length to run a bit too long. In order to perform an MHC on this hardware, the artificially long channel length must be accounted for in the software simulation.

One of the main conventional processes to evaluate MHC is a Best Case/Worst Case Analysis. This allows designers to see the overall margin in their designs by simulating best and worst case hardware, and comparing to the fastest and slowest hardware that the manufacturing line would deliver to a customer. The problem with this analysis is it simply reflects if the amount of bounding in simulation is adequate for the process variations in manufacturing. This type of analysis does not pinpoint individual process parameters and their effect on circuit performance.

Therefore, the invention allows for the incorporation of device (semiconductor chip) specific parametric data into a circuit simulation. The simulation can be tailored to reflect the performance and behavior of a specific device, by running several device-specific simulations of this type and comparing the results to the respective devices, one ordinarily skilled in the art can accurately pinpoint the circuit sensitivities to individual process parameters. The MHC attempts to match the behavior and performance of the specific devices, instead of bounding the timing with Best Case/Worst Case analysis.

This invention also allows the qualification engineer to model the effects of several manufacturing process variations which have not been accurately modeled. Further, the invention allows for the accurate incorporation of threshold voltage adjustment implant variation into the circuit simulation by way of an iterative simulation methodology. Presently there exists no way to accurately incorporate the true threshold voltage of a device specific simulation.

SUMMARY OF THE INVENTION

The invention includes a method of performing model to hardware correlation that simulates models based upon design criteria and manufactures devices based upon the design criteria. The method evaluates features of the devices during the manufacturing to produce in-line test parametric data, compares the models to the in-line test parametric data to obtain correlation data, and modifies the simulating according to the correlation data.

Further, the simulating process produces geometric, DC, AC, and delay stage simulated parameters, and the in-line test parametric data includes geometric, DC, AC, and delay stage test parameters. The modifying process produces a modified simulation and the invention also identifies, in a characterization map, the devices that match models produced by the modified simulation.

The devices are preferably semiconductors. The models produce modeled threshold voltage values. The in-line test parametric data has test threshold voltage values. The comparing process compares the modeled threshold voltage values and the test threshold voltage values to produce a threshold voltage adder. The modifying process includes adding the threshold voltage adder to the modeled threshold voltage values. In addition, the models have saturated current values. The in-line test parametric data has test saturated current values and the invention compares the modeled saturated current values and the test saturation saturated current values to produce a saturated current error value. Also, the semiconductor devices have a delay per stage values. The in-line test parametric data can have test delay per stage values. The invention compares modeled delay per stage values and the test saturation delay per stage values to produce a delay per stage error value.

Further, the invention culls the in-line test parametric data to retain selected geometric, D.C., A.C. and delay test parameters and identifies defective devices and removes the defective devices from the in-line test parametric data.

BRIEF DESCRIPTION OF THE DRAWINGS

The foregoing and other objects, aspects and advantages will be better understood from the following detailed description of a preferred embodiment(s) of the invention with reference to the drawings, in which.

DETAILED DESCRIPTION OF PREFERRED EMBODIMENTS OF THE INVENTION

Figure 1:
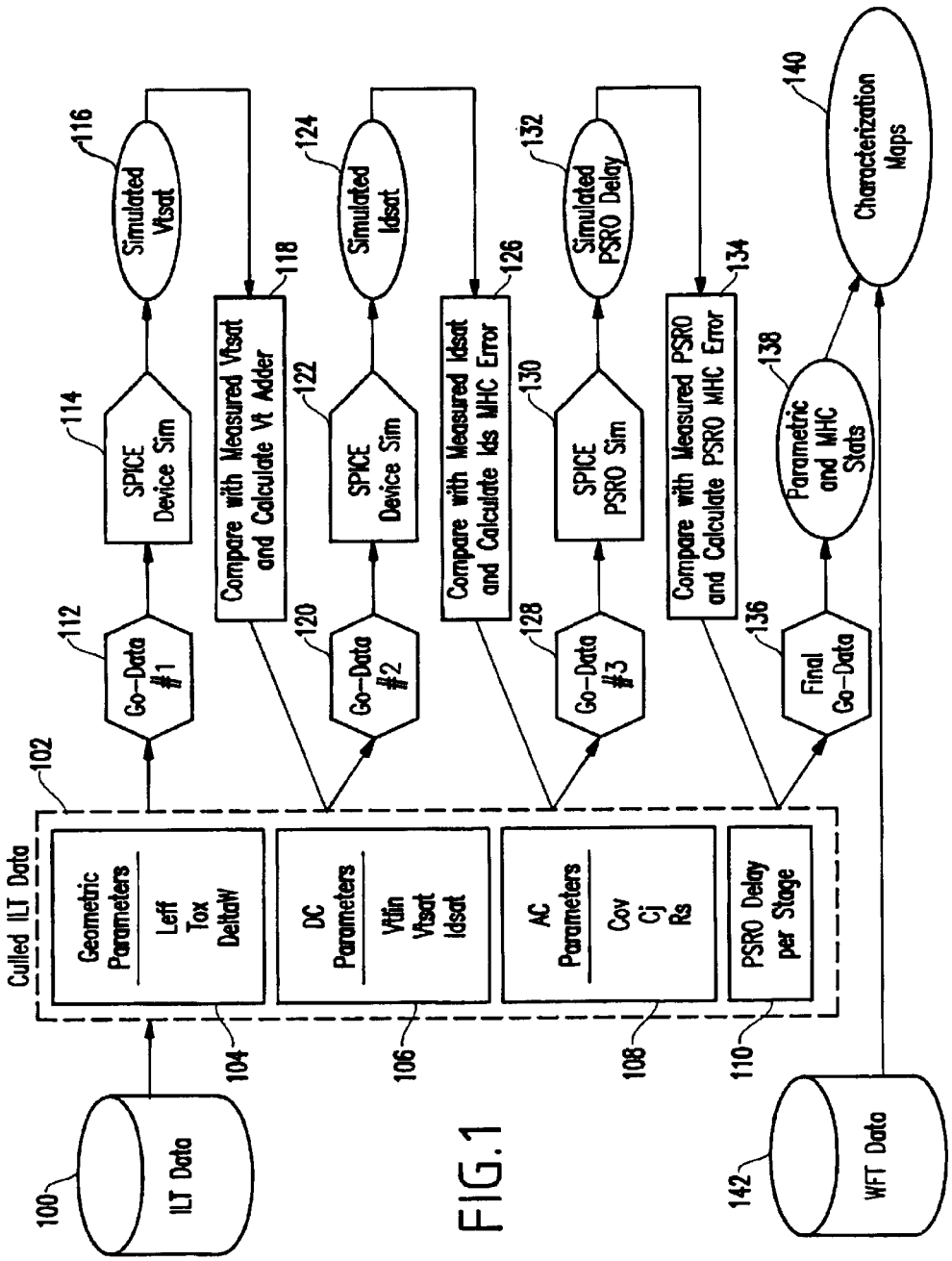
FIG. 1 is a schematic diagram of one system embodiment of the invention.

As mentioned above, there is a need to improve upon the accuracy of correlating the software simulations to the actual hardware results. This disclosure details a method and system of obtaining the value of any process skew, such as process skew into a SPICE based circuit or device simulation, so as to more accurately reflect the hardware under test. SPICE (Simulation Program with Integrated Circuit Emphasis) was developed by University of California Berkeley and licensed to many companies. Most references to SPICE are not trademarked. The IBM versions of SPICE are called AS/X and PowerSPICES (International Business Machines Corp., Armonk, N.Y.).

SPICE is a circuit simulation tool that allows one ordinarily skilled in the art to simulate the performance and behavior of a circuit before actual fabrication in the manufacturing line. In order to simulate a circuit, SPICE must specify the circuit elements (transistors, resistors, etc), the circuit design (the nodes of the circuit elements that are connected to the nodes of other circuit elements) to be defined and the device models to be used for the behavioral simulation of each of the elements. The most important device models for the simulation of semiconductor devices are the transistor models which describe the nominal parameters associated with the transistors in the technology that the circuit will be fabricated using. SPICE takes these nominal device parameters, plugs them into the BSIM (Berkeley Short-Channel IGFET (Insulated Gate Field Effect Transistor) Model) equations, and calculates the transistor voltages and currents. For the purposes of MHC, SPICE is used to verify the device models, the circuit designs and the final manufactured hardware. SPICE allows the simulator to override the nominal parameters in device models with specific data known as "go-data". It is through this interface that the invention is able to affect the behavioral simulation with actual semiconductor parameters.

While the invention is discussed herein in relationship to the SPICE software simulation program and to the modeling of semiconductor chip manufacturing processes, as would be known by one ordinarily skilled in the art given this disclosure, the invention is not limited to this single application. To the contrary, the invention is broadly applicable to all forms of modeling software that simulate a production environment. For example, HSPICE and PowerSPICE, two other industry standard simulation tools, provide the parametric interface to allow the same affect to be included in circuit simulations. In fact, many industry standard and corporate proprietary simulation systems allow this feature.

The invention allows the direct matching of a single device's (e.g., a semiconductor chip) hardware measurements to the simulation results that are biased to account for that particular parametric data. More specifically, referring now to FIGS. 1 and 2, the invention starts by obtaining the raw parametric data for a specific set of hardware 100, 200.

During conventional semiconductor manufacturing, various parameters are tested at different stages of the fabrication line. For the invention, it is most useful to extract the data from the latest possible stage in the manufacturing process due to the fact that later processes may alter the parametric data from earlier testing. By extracting the data at the latest possible test step, the parametrics more accurately reflect the actual hardware device that is delivered by the manufacturing line.

Once the raw parametric data is obtained, the important parameters must be culled out of the data to reduce data volumes and streamline the method 102, 202. In one example of an array of semiconductor transistors being manufactured on a semiconductor ship, important parameters used for modeling are listed below:

| Parameter | Description |
|---|---|
| Geometric Parameters (104): | |
| Leff | Effective Transistor Channel Length |
| Tox | Gate Oxide Thickness (at inversion conditions) |
| Delta W | Change in Device Width (from design dimensions) |
| DC Parameters (106): | |
| Idsat | Saturated Source/Drain Current (short channel device) |
| Vtsat | Saturation Threshold Voltage (short channel) |
| Vtlin | Linear Threshold Voltage (long channel device) |
| AC Parameters (108): | |
| Cov | Overlap Capacitance |
| Cj | Source/Drain Junction Capacitance |
| Rs | Sheet Resistance |
| Delay Parameters (110): | |
| PSRO | Delay per Stage of Kerf Performance Screen Ring Oscillator |

These parameters should be measured on all devices and structures of interest. For example, the device parametrics should be measured on N channel and P channel transistors, single and dual oxide transistors (if applicable), zero-Vt transistors (if applicable). The Sheet Resistance should be measured on many different types of parasitic structures, such as: N+ diffusion, P+ diffusion, substrate, N-well, all metal layers, other level resistors, etc.

The parameters listed above comprise a set of important parameters that have been experimentally shown to have the largest circuit sensitivities on typical digital circuits. Because of their extreme circuit sensitivities, these parameters have the largest effect on the performance and behavior of the circuit and must be monitored so that the values of these parameters can be used for calculation of the "go-data". For other circuit applications, different parameters may be of more critical importance. For example, several circuits are extremely dependant on metal-level line width biases. The present invention allows for the expansion of the parameter set to include these line width biases to be included in the simulations if required.

Then the invention removes chips with "bad" or "error" data from the in-line parametric data database 204 and outputs a "screens" file to tell which parameter is causing screen loss 205. This not only streamlines the process, but also verifies the in-line test data before time is used in the rest of the procedure. By screening the in-line test data in the same manner the manufacturing line would be screened and one ordinarily skilled in the art could weed out devices that would have been thrown away in manufacturing screens. There is no point performing the MHC process on devices that would not have been processed in the line.

Initially, the parametric data is put into files called "go-data" 112, 206. In this example, the invention would use the geometric test parameters 104 (Leff, Tox, DeltaW), to calculate a short channel Vtsat and Idsat 116, 208. This calculation is from the BSIM equations and is extremely complex. For reference purposes, all of the equations needed to calculate Vtsat are in the BSIM users manual, incorporated herein by reference.

This Vtsat 116 is different than the Vtsat that would be calculated by the simulation program on its own (e.g., without any test data and based solely upon design parameters) because Vtsat 116 is based upon actual in-line test geometric parameters 104. In a preferred embodiment, the invention extracts the simulated Vtsat 116 for each chip under simulation. From Vtsat and Idsat, the invention calculates Vterror and Idserror as a percentage of actual measured Vtsat and Idsat values 209.

Once the short channel Vtsat 116 for each chip of interest is modeled from the test geometric parameters, the value is compared to the actual measured short channel Vtsat from the in-line test parametric data 118. This process isolates any inaccuracy the simulation program may contain with respect to the Vtsat calculation. Since the modeling of the Vtsat 116 is based upon actual test geometric parameters and the Vtsat 116 is compared to actual measured Vtsat test data, the Vtsat aspect of the simulation program is isolated from other modeling aspects, which allows a true correction to be made to this isolated portion of the simulation program. For example, from this process a correction (e.g., Vtadder 210) can be calculated. If nominal parameters are as follows: (Leff=0.11 um, DeltaW=0.03 um and Tox=45 nm) then the BSIM model will calculate a Vtsat of 435 mV (these numbers are examples only). If the actual device of interest has a shorter Leff, the Vtsat will be lower. If the Tox is thinner, the Vtsat will be lower as well. The BSIM equations account for the calculation of Vtsat incorporating all of these parameters. So, SPICE calculates the expected Vtsat for a specific device. The invention then compares the simulated Vtsat to the actual measured Vtsat and makes a Vtadder 210. This calculation is actually quite simple: Vtsat(measured)–Vtsat(SPICE)=Vtadder. This adder is then applied via "go-data" 120, 212 as an Vtsat offset to the simulation again 214 to verify that it was calculated properly by checking to see if Vterror is 0 (216). Once again Vterror and Idserror are calculated as percentages of actual measured Idsat and Vtsat values 215.

Therefore, an important feature of the invention is the isolation of selected modeling processes within a simulation program to provide a correction to this selected and isolated portion of the modeling process. In other words, the invention supplies actual test data (instead of design parameters) to a specific, modeling function and then compares the output of the modeling function to actual test results to establish a correction for that specific modeling function. An important benefit produced by this feature of the invention is that once the individual modeling feature is isolated and a correction value established, more accurate modeling can be accomplished. For example, with respect to semiconductor transistors, the corrected model of Vtsat can account for threshold implant doses that are intentionally varied to allow model to hardware correlation for an entire process window.

The "go-data" corrects the parametric values for all transistors on a chip and is therefore extendable to all semiconductor designs. Further, the invention is capable of handling multiple different technologies (different device models) and all types of designs within such technology.

There are multiple, separate and distinct "go-data" databases 112, 120, 128 that are output at different points in the process. The final "go-data" 136 is the output of the entire process. The intermediate "go-data's" exist only for intermediate steps to get to the final "go-data" and for history and additional information.

This inventive aspect of isolating and correcting a specific modeling function within a simulation program can be repeated at any point (or at many points) of the simulation program. For example, with respect to the manufacturer of semiconductor transistors devices, it is important to find an accurate correction for the modeling of the Idsat. This calculation is directly from the BSIM equations and is extremely complex and included in the BSIM users guide.

With the invention, the Idsat 124 is modeled from the Vtlin and Vtsat in-line test data 122 and is compared 126 to measured Idsat from the in-line tested parametric data 106. The result of this comparison is also added to go-data 128, 218. Id is the output of the BSIM equations and, therefore, a good gauge of the success of the individual device simulation. The comparison between Idsat(measured) and Idsat (SPICE) results in an Idserror value (in percentage of the measured value) and is done to measure the accuracy of the single device simulation, and to verify that the application of the Vtadder accomplished it's intent.

The Idserror calculation provides an assessment of the success of the device MHC before time is used in circuit simulation. This verifies the methodology to this point, the in-line data tested for DC device parametrics (Leff, Tox, DeltaW, Idsat, Vtlin, Vtsat) and the device simulation strategy. If the Idserror values show that the device simulation using the "go-data" is not calculating the Idsat on a single device accurately, there is no chance that the SPICE simulation of a large scale circuit, using the same "go-data," will result in an accurate performance or behavioral result for the circuit. So, one ordinarily skilled in the art can avoid running long-duration (often several weeks of computing resources), massive circuit simulations if the Idserror at the device level is determined to be unacceptable.

In a similar manner the invention can be used to improve the quality of and verify the AC simulation. It is conventional to establish a Performance Screen Ring Oscillator (PSRO) in the kerf being in-line tested. First the delay per stage of the PSRO is simulated 130 using the actual parametrics in-line variables Cov, Cj, Rs 108. Another SPICE circuit simulation is run that contains the design elements for the PSRO that is fabricated in the kerf. SPICE simulates this simple circuit the same way it would simulate a single device or a much larger circuit. SPICE applies the current set of "go-data" and simulates the rising and falling transition of the inverter designed into the PSRO 220. By averaging the rising transition delay with the falling transition delay, SPICE is able to calculate a delay-per-stage value.

Preferably, the circuit simulation delivers a delay per stage of the PSRO for each chip under simulation. This value is then compared to the in-line test data measured PSRO delay to verify the parameters that could affect the AC performance (Rs, Cov, Cj) 134, 220 and produce a delay per stage as a percentage of measured values 221. The verification process allows one of ordinary skill in the art to make a judgement call on the quality of the "go-data." If the go-data is not allowing SPICE to accurately simulate a small ring oscillator, there is no chance a larger circuit, and SRAM for example, will correlate correctly.

The invention then adds this PSRO Error value to the "go-data" database 136, 222 to finalize the go-data database. The invention cleans up the test and outputs a final "go-data" file 224. While DC, AC and delay modeling aspects are verified and corrected in the above example, one ordinarily skilled in the art would understand that the invention is not limited to these specific corrections. To the contrary, the invention can be used to verify and correct any aspect of the simulation program. For analog circuits, several other aspects may be of importance. For example, the present invention is completely extendable to other types of sensitivity analysis and corrections. A simple gain calculation can be performed by the invention and used to compare with a measured gain in order to produce an analog "go-data" set for amplifier correlations.

Figure 3:
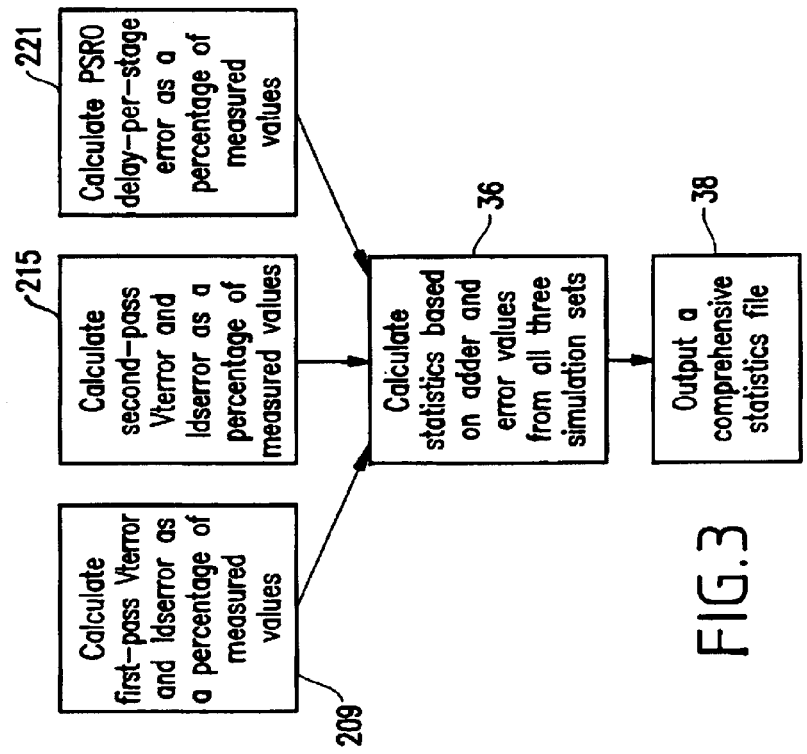
FIG. 3 is a flow diagram illustrating a preferred method of the invention.

The software package then examines the MHC of the devices (pre and post Vtadder) and the MHC of the PSRO pre and post correction and prepares results files to examine the final process parametric data 138, 226. These files show statistics about the success in modeling with the process data included. This process is shown in greater detail in FIG. 3. More specifically, as discussed above, the invention examines the modeling to hardware correlation before the correction Vtadder is performed as well as the modeling to hardware correlation after such correction is performed 209. The invention looks at the Idserror before and after the Vtadder has been applied 215. Also, the invention examines the PSRO delay error 221. Then, the invention prepares statistics regarding the accuracy of the modeling in item 36. These statistics are used to make the judgements as to the quality of the "go-data" in a comprehensive statistics file 38. They are used as simple methods for examining device model updates which are often fitted to a single piece of nominal hardware. The invention allows the quick simulation and comparison of device values on many chips (the entire process for 1000 chips may take approximately 15 minutes). So, these statistics show the validity of applying a device model fitted to one piece of hardware to an extremely large sample of chips. In this way, one engineer ordinarily skilled in the art can direct the efforts of transistor modelers towards the specific parameter that may be incorrectly modeled.

Figure 4:
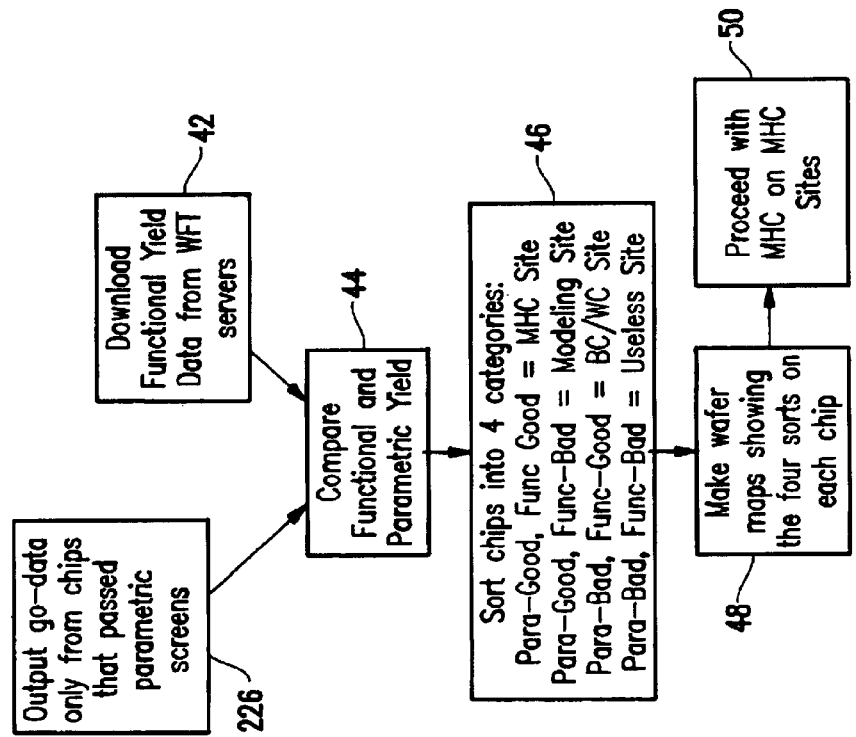
FIG. 4 is a schematic diagram of a characterization map.

The invention outputs "go-data" only from chips that passed parametric screens 226 and also downloads final functional test data from the Wafer Final Test (WFT) servers 42, as shown in FIG. 4. The WFT servers 142 (FIG. 1) contain functional yield data which tells the invention whether a specific chip is functional or not. There is no purpose wasting time simulating with "go-data" that apply to chips that do not function. The functional and parametric yield is compared in item 44, in FIG. 4.

Then the invention sorts the chips into 4 categories as shown in item 46. Those chips that have good functional and parametric yields are available for MHC. Those that have bad functionality are available for the modeling site. Those that have bad parametrics are available for the BL/WC site. Finally, those that have both bad functionality and bad parametrics are useless. In item 48, the invention makes wafer maps showing the four sorting results on each chip. In item 50 the invention proceeds with MHC chips on MHC sites.

Figure 2:
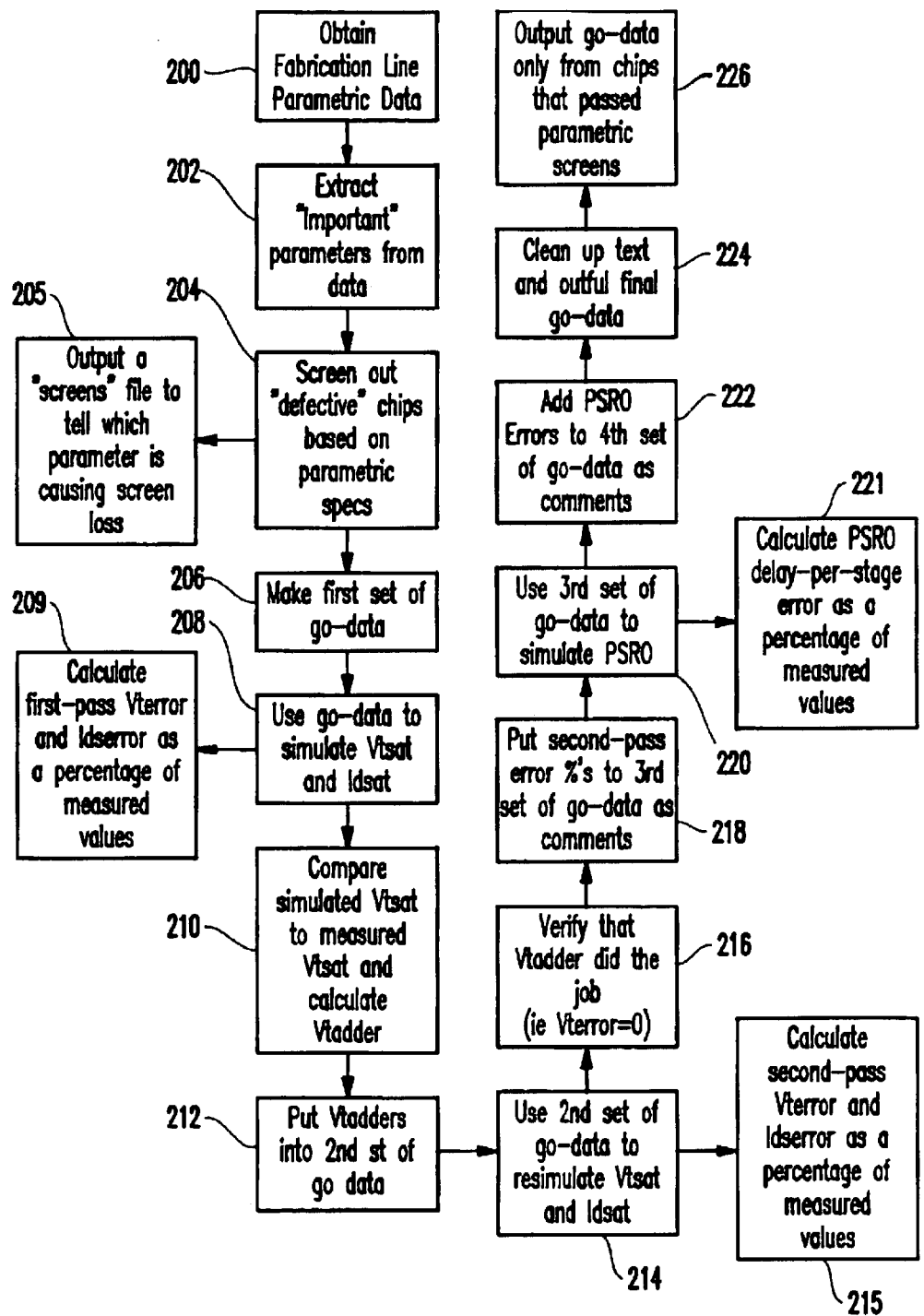
FIG. 2 is a flow diagram illustrating a preferred method of the invention.

Similarly, as shown in FIG. 1, in item 140, the WFT data 142 is combined with the simulation statistics 138 to produce wafer maps (48) indicating chips for which a full MHC is possible. The "go-data" is now culled down once again at this point. Once the complete set of "go-data" is compiled and analyzed, the "go-data" corresponding to non-functional chips are discarded and the remaining "go-data" represent a set of functional and parametrically "good" chips that may be used for the larger simulations that represent the bulk of the MHC effort.

The requirements for such full MHC chips are as follows. The chips must pass the initial process parametric screens such as, Leff and Tox must be within the manufacturing process specification, and the chips must yield through final functional test. Once these files are examined, chips for a full MHC can be selected. In order to proceed with the bulk of the MHC effort, a sample of hardware must be selected. A typical lot will result in ~1500 in-line tested chips, <1000 "good" "go-datas" and perhaps 500 functional chips with "good" "go-data." The massive circuit simulations cannot run on 500 different chips and, so one ordinarily skilled in the art selects, perhaps, 25 chips from the full-MHC list that fall into different process splits (i.e., High NFET Vt implant, short Leff) to proceed with the MHC process.

Figure 5:
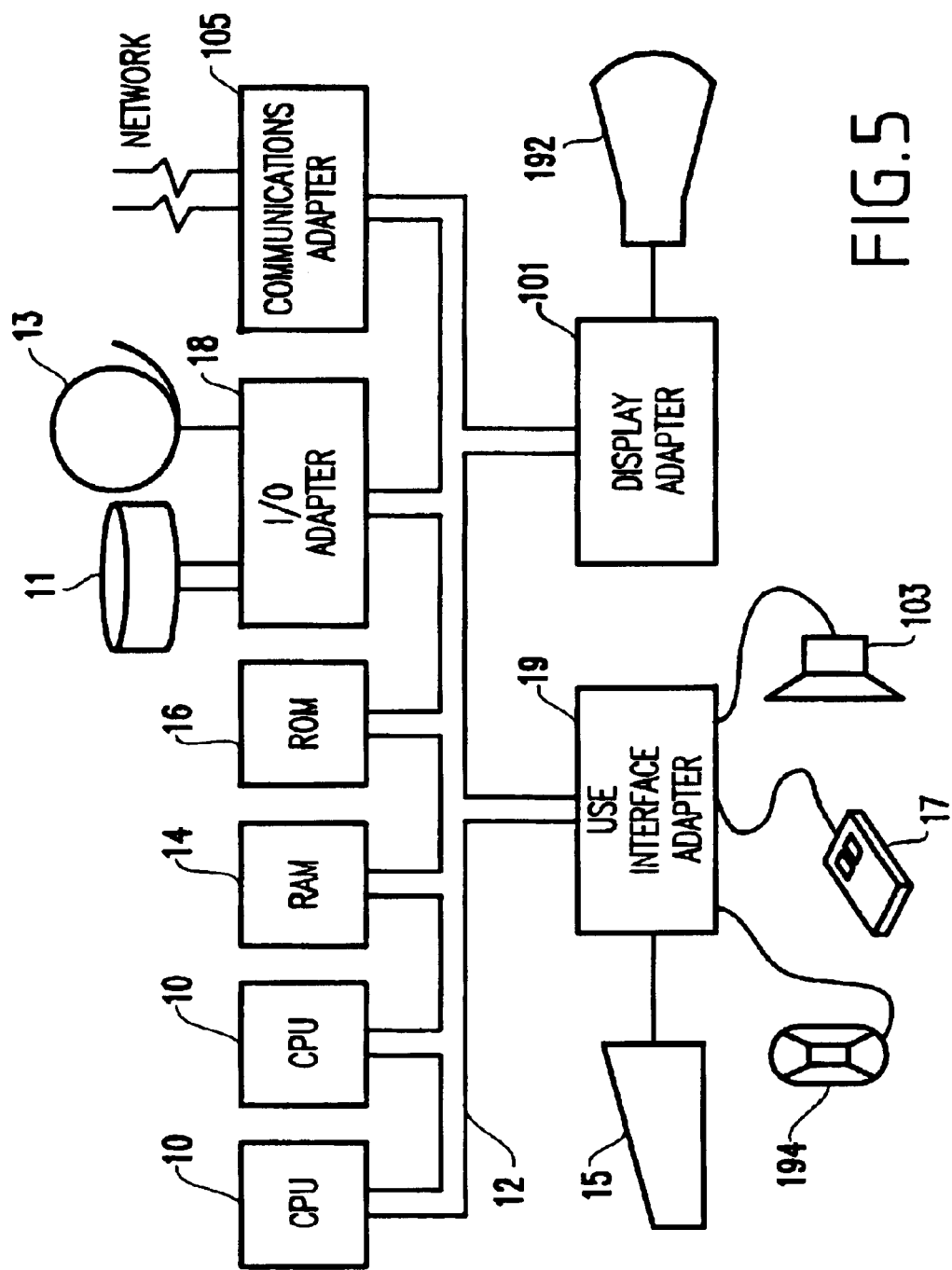
FIG. 5 is a schematic diagram of a hardware embodiment of the invention.

A representative hardware environment for practicing the present invention is depicted in FIG. 5, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 194, and/or other user interface devices such as touch screen device (not shown) to bus 12, communication adapter 105 for connecting the information handling system to a data processing network, and display adapter 101 for connecting bus 12 to display device 192. A program storage device readable by the disk or tape units, is used to load the instructions which operate on a wiring interconnect design which is loaded also loaded onto the computer system.

In practice, the corrected simulation programs are then passed onto the circuit designers in order to simulate different circuits. These simulations are then used to produce timing specifications for the circuit library. This methodology is extremely useful for all types of simulation programs. Minor modifications of the method can be easily implemented on new products or in new technologies.

To adapt the invention to different technologies an examination of the in-line parametric data available should be performed to decide which data should be culled from the In-Line Test (ILT) servers. Also, the relationship between ILT coordinates and WFT coordinates should be determined to allow the characterization map to be formulated easily.

As discussed above, the main alternative method for Model to Hardware Correlation is a Best Case/Worst Case Analysis, which allows designers to see the overall margin in their designs by simulating best and worst case hardware, and comparing the fastest and slowest hardware that the manufacturing line would deliver to a customer. However, such analysis simply reflects if the amount of bounding in simulation is adequate for the process variations in manufacturing. This type of analysis does not pinpoint individual process parameters and their affect on circuit performance as a "go-data" based simulation does. The "go-data" based simulation method strives to simulate each chip as correctly as possible, not just to bound it by allowing the models best and worst case predictions to stray far enough to encompass all the possible hardware. In addition, the "go-data" based simulations allow the designer to set the best and worst case circuit timing limits based on individual process parameters. This typically leads to tighter timing distributions that are more competitive in the industry.

By encapsulating this process into a simple software package with a GUI adaptable to any platform, the MHC process can be extended across customer lines. For example, instead of performing customer specific MHC for individual parts, the customer can run all of this activity in their own lab. This represents a paradigm shift in the way customer parts are currently qualified.

While the invention has been described in terms of preferred embodiments, those skilled in the art will recognize that the invention can be practiced with modification within the spirit and scope of the appended claims.

What is claimed is:

1. A method of performing model to hardware correlation, comprising:
   simulating models based upon design criteria;
   manufacturing devices based upon said design criteria;
   evaluating features of said devices to produce test parametric data;
   removing defective devices from said test parametric data;
   comparing said models to said test parametric data to obtain correlation data; and
   modifying said simulating according to said correlation data.

2. The method in claim 1, wherein said simulating produces geometric, DC, AC, and delay stage simulated parameters, and
   wherein said test parametric data includes geometric, DC, AC, and delay stage test parameters.

3. The method in claim 1, wherein said modifying produces a modified simulation and said method further comprises identifying, in a characterization map, ones of said devices that match models produced by said modified simulation.

4. The method in claim 1, wherein:
   said devices comprise semiconductor devices;
   said models include modeled threshold voltage values;
   said test parametric data includes test threshold voltage values;
   said comparing compares said modeled threshold voltage values and said test threshold voltage values to produce a threshold voltage adder; and
   said modifying includes adding said threshold voltage adder to said modeled threshold voltage values.

5. The method in claim 1, wherein:
   said devices comprise semiconductor devices;
   said models include modeled saturated current values;
   said test parametric data includes test saturated current values;
   said comparing compares said modeled saturated current values and said test saturation saturated current values to produce a saturated current error value.

6. The method in claim 1, wherein:
   said devices comprise semiconductor devices;
   said models include modeled delay per stage values;
   said test parametric data includes test delay per stage values;
   said comparing compares said modeled delay per stage values and said test saturation delay per stage values to produce a delay per stage error value.

7. The method in claim 1, further comprising culling said test parametric data to retain selected geometric, D.C., A.C. and delay test parameters.

8. A method of performing model to hardware correlation, comprising:
   simulating models based upon design criteria;
   manufacturing devices based upon said design criteria;
   evaluating features of said devices during said manufacturing to produce in line test parametric data;
   identifying defective devices and removing said defective devices from said in line test parametric data;
   comparing said models to said in line test parametric data to obtain correlation data; and modifying said simulating in according to said correlation data.

9. A method of correcting a hardware modeling process, said method comprising:
   manufacturing devices based on design criteria;
   measuring features of non-defective ones of said devices to produce measured features;
   isolating a portion of said modeling process;
   supplying at least one of said measured features to said portion of said modeling process, wherein said portion of said modeling process outputs a simulated result;
   comparing said simulated result to a corresponding measured feature of said measured features; and
   calculating a correction to said portion of said modeling process based on said comparing.

10. The method in claim 9, wherein said simulated result and said corresponding measured feature comprise one of a voltage, current, and physical dimension.

11. The method in claim 9, wherein said portion of said modeling process simulates an integrated circuit design to model one of saturation threshold voltage, saturated source/drain current, and delay per stage.

12. The method in claim 9, further comprising repeating said method for second portions of said modeling process to produce second corrections.

13. The method in claim 12, further comprising modifying said modeling process based on said correction and said second corrections, such that said modeling process automatically makes said corrections after performing a simulation.

14. The method in claim 9, wherein said measuring comprises measuring physical dimensions and performance operations of said devices at different points of said manufacturing of said devices.

15. The method in claim 9, further comprising performing a statistical analysis based on results of said comparing process.

16. A method of performing model to hardware correlation for semiconductor chips, comprising:
   obtaining fabrication parametric data;
   extracting first parameters from said parametric data to make a first set of go-data;
   removing defective chips from said first set of go-data;
   calculating a first simulated threshold voltage saturation and first simulated saturated source/drain current based on said first set of go-data using a modeling program;
   performing a first comparing of said first simulated threshold voltage saturation to an parametric threshold voltage saturation from said parametric data and a first comparing of said first simulated saturated source/drain current to an parametric saturated source/drain current from said parametric data;
   calculating a threshold voltage adder from said first comparing; and
   correcting said modeling program using said threshold voltage adder.

17. The method in claim 16, further comprising
   adding said threshold voltage adder to said first set of go-data to make a second set of go-data;
   calculating a second simulated threshold voltage saturation and second simulated saturated source/drain current based on said second set of go-data using said modeling program;

performing a second comparing of said second simulated threshold voltage saturation to said parametric threshold voltage saturation and a second comparing of said second simulated saturated source/drain current to said parametric saturated source/drain current; and verifying that said threshold voltage adder corrected said second simulated threshold voltage saturation and said second simulated saturated source/drain current.

18. A method of performing model to hardware correlation for semiconductor chips, comprising:

obtaining fabrication in-line parametric data;

extracting first parameters from said parametric data to make a first set of go-data;

calculating a first simulated threshold voltage saturation and first simulated saturated source/drain current based on said first set of go-data using a modeling program;

performing a first comparing of said first simulated threshold voltage saturation to an in-line parametric threshold voltage saturation from said parametric data and a first comparing of said first simulated saturated source/drain current to an in-line parametric saturated source/drain current from said parametric data;

calculating a threshold voltage adder from said first comparing;

correcting said modeling program using said threshold voltage adder;

adding said threshold voltage adder to said first set of go-data to make a second set of go-data;

calculating a second simulated threshold voltage saturation and second simulated saturated source/drain current based on said second set of go-data using said modeling program;

performing a second comparing of said second simulated threshold voltage saturation to said in-line parametric threshold voltage saturation and a second comparing of said second simulated saturated source/drain current to said in-line parametric saturated source/drain current;

verifying that said threshold voltage adder corrected said second simulated threshold voltage saturation and said second simulated saturated source/drain current; and calculating a percentage error based on said second comparing process and adding said percentage error to said second set of go-data to make a third set of go-data.

19. The method in claim 18, further comprising:

calculating a simulated delay-per-stage based on said third set of go-data using said modeling program;

performing a third comparing of said simulated delay-per-stage to an in-line parametric delay-per-stage from said parametric data; and calculating a delay-per-stage error based on said third comparing process.

20. The method in claim 19, further comprising:

adding said delay-per-stage error to said third set of go-data to make a final set of go-data; and outputting statistics based on said threshold voltage adder, said percentage error and said delay-per-stage error.

21. The method in claim 18, further comprising:

performing a fourth comparing of parametric yield data from said final set of go-data to functional yield data from wafer final test servers;

selecting acceptable chips which have good parametric yield data and good functional yield data from said fourth comparing process; and creating a model to hardware wafer map showing locations of said acceptable chips.

22. The method in claim 21, further comprising performing a model to hardware comparison using said model to hardware wafer map.

23. A method of performing model to hardware correlation for semiconductor chips, comprising:

obtaining fabrication parametric data;

extracting first parameters from said parametric data to make a first set of go-data;

removing defective chips from said first parameters to make said first set of go-data;

calculating a first simulated threshold voltage saturation and first simulated saturated source/drain current based on said first set of go-data using a modeling program;

performing a first comparing of said first simulated threshold voltage saturation to an parametric threshold voltage saturation from said parametric data and a first comparing of said first simulated saturated source/drain current to an parametric saturated source/drain current from said parametric data;

calculating a threshold voltage adder from said first comparing; and correcting said model program using said threshold voltage adder.

24. A method of performing model to hardware correlation for semiconductor chips, comprising:

obtaining fabrication in-line parametric data;

extracting first parameters from said parametric data to make a first set of go-data;

calculating a first simulated threshold voltage saturation and first simulated saturated source/drain current based on said first set of go-data using a modeling program;

performing a first comparing of said first simulated threshold voltage saturation to an in-line parametric threshold voltage saturation from said parametric data and a first comparing of said first simulated saturated source/drain current to an in-line parametric saturated source/drain current from said parametric data;

calculating a threshold voltage adder from said first comparing;

adding said threshold voltage adder to said first set of go-data to make a second set of go-data;

calculating a second simulated threshold voltage saturation and second simulated saturated source/drain current based on said second set of go-data using said modeling program;

performing a second comparing of said second simulated threshold voltage saturation to said in-line parametric threshold voltage saturation and a second comparing of said second simulated saturated source/drain current to said in-line parametric saturated source/drain current;

calculating a percentage error based on said second comparing process and adding said percentage error to said second set of go-data to make a third set of go-data;

calculating a simulated delay-per-stage based on said third set of go-data using said modeling program;

performing a third comparing of said simulated delay-per-stage to an in-line parametric delay-per-stage from said parametric data;

calculating a delay-per-stage error based on said third comparing process;

adding said delay-per-stage error to said third set of go-data to make a final set of go-data; and correcting said modeling program using said final set of go-data.

25. The method in claim 24, further comprising, after said extracting, removing defective chips from said first parameters to make said first set of go-data.

26. The method in claim 24, further comprising, after said second comparing, verifying that said threshold voltage adder corrected said second simulated threshold voltage saturation and said second simulated saturated source/drain current.

27. The method in claim 24, further comprising outputting statistics based on said threshold voltage adder, said percentage error and said delay-per-stage error.

28. The method in claim 24, further comprising:
performing a fourth comparing of parametric yield data from said final set of go-data to functional yield data from wafer final test servers;
selecting acceptable chips which have good parametric yield data and good functional yield data from said fourth comparing process;
creating a model to hardware wafer map showing locations of said acceptable chips; and
performing a model to hardware comparison using said model to hardware wafer map.

29. A method of performing model to hardware correlation for semiconductor chips, comprising:
obtaining fabrication line parametric data;
extracting first parameters from said parametric data;
removing defective chips from said first parameters to make a first set of go-data;
calculating a first simulated threshold voltage saturation and first simulated saturated source/drain current based on said first set of go-data using a modeling program;
performing a first comparing of said first simulated threshold voltage saturation to an in-line parametric threshold voltage saturation from said parametric data and a first comparing of said first simulated saturated source/drain current to an in-line parametric saturated source/drain current from said parametric data;
calculating a threshold voltage adder from said first comparing;
adding said threshold voltage adder to said first set of go-data to make a second set of go-data;
calculating a second simulated threshold voltage saturation and second simulated saturated source/drain current based on said second set of go-data using said modeling program;
performing a second comparing of said second simulated threshold voltage saturation to said in-line parametric threshold voltage saturation and a second comparing of said second simulated saturated source/drain current to said in-line parametric saturated source/drain current;
verifying that said threshold voltage adder corrected said second simulated threshold voltage saturation and said second simulated saturated source/drain current;
calculating a percentage error based on said second comparing process and adding said percentage error to said second set of go-data to make a third set of go-data;
calculating a simulated delay-per-stage based on said third set of go-data using said modeling program;
performing a third comparing of said simulated delay-per-stage to an in-line parametric delay-per-stage from said parametric data;
calculating a delay-per-stage error based on said third comparing process;
adding said delay-per-stage error to said third set of go-data to make a final set of go-data;
outputting statistics based on said threshold voltage adder, said percentage error and said delay-per-stage error;
performing a fourth comparing of parametric yield data from said final set of go-data to functional yield data from wafer final test servers;
selecting acceptable chips which have good parametric yield data and good functional yield data from said fourth comparing process;
creating a model to hardware wafer map showing locations of said acceptable chips; and
performing a model to hardware comparison using said model to hardware wafer map.

30. A program storage device readable by machine, tangibly embodying a program of instructions executable by the machine to perform method steps for performing model to hardware correlation, comprising:
simulating models based upon design criteria;
manufacturing devices based upon said design criteria;
evaluating features of said devices to produce test parametric data;
removing defective devices from said test parametric data;
comparing said models to said test parametric data to obtain correlation data; and
modifying said simulating according to said correlation data.

31. The program storage device as claimed in claim 30, wherein said simulating produces geometric, DC, AC, and delay stage simulated parameters, and
wherein said test parametric data includes geometric, DC, AC, and delay stage test parameters.

32. The program storage device as claimed in claim 30, wherein said modifying produces a modified simulation and said method further comprises identifying, in a characterization map, ones of said devices that match models produced by said modified simulation.

33. The program storage device as claimed method in claim 30, wherein:
said devices comprise semiconductor devices;
said models include modeled threshold voltage values;
said test parametric data includes test threshold voltage values;
said comparing compares said modeled threshold voltage values and said test threshold voltage values to produce a threshold voltage adder; and
said modifying includes adding said threshold voltage adder to said modeled threshold voltage values.

34. The program storage device as claimed method in claim 30, wherein:
said devices comprise semiconductor devices;
said models include modeled saturated current values;
said test parametric data includes test saturated current values;
said comparing compares said modeled saturated current values and said test saturation saturated current values to produce a saturated current error value.

35. The program storage device as claimed method in claim 30, wherein:
said devices comprise semiconductor devices;
said models include modeled delay per stage values;
said test parametric data includes test delay per stage values;
said comparing compares said modeled delay per stage values and said test saturation delay per stage values to produce a delay per stage error value.

36. The program storage device as claimed method in claim 30, further comprising culling said test parametric data to retain selected geometric, D.C., A.C. and delay test parameters.

* * * * *